(12) United States Patent
Park et al.

(10) Patent No.: US 10,870,501 B2
(45) Date of Patent: Dec. 22, 2020

(54) FLIGHT VEHICLE ATTITUDE CONTROL SYSTEM DESIGN METHOD AND DEVICE

(71) Applicant: KOREA AEROSPACE RESEARCH INSTITUTE, Daejeon (KR)

(72) Inventors: Yong-Kyu Park, Daejeon (KR); Byung-Chan Sun, Daejeon (KR)

(73) Assignee: KOREA AEROSPACE RESEARCH INSTITUTE, Daejeon (KR)

( * ) Notice: Subject to any disclaimer, the term of this patent is extended or adjusted under 35 U.S.C. 154(b) by 88 days.

(21) Appl. No.: 16/200,952

(22) Filed: Nov. 27, 2018

(65) Prior Publication Data
US 2019/0177010 A1 Jun. 13, 2019

(30) Foreign Application Priority Data

Dec. 8, 2017 (KR) .......................... 10-2017-0168485

(51) Int. Cl.
  *B64F 5/60* (2017.01)
  *G01M 9/08* (2006.01)
  *G06F 30/20* (2020.01)
(52) U.S. Cl.
  CPC ................ *B64F 5/60* (2017.01); *G01M 9/08* (2013.01); *G06F 30/20* (2020.01)
(58) Field of Classification Search
  CPC .. B64F 5/60; B64F 5/00; G06F 30/20; G01M 9/08
  See application file for complete search history.

(56) References Cited

U.S. PATENT DOCUMENTS

| 2005/0131592 | A1* | 6/2005 | Chiang | ................... | B64G 1/24 |
| | | | | | 701/13 |
| 2013/0124177 | A1* | 5/2013 | Falangas | ................. | G06F 30/15 |
| | | | | | 703/8 |
| 2015/0203215 | A1* | 7/2015 | Falangas | ................... | B64F 5/00 |
| | | | | | 703/2 |

FOREIGN PATENT DOCUMENTS

KR          10-1184625          * 9/2012

OTHER PUBLICATIONS

KR10-1184625—Machine Translation; IP.com, Sep. 2012.*

* cited by examiner

*Primary Examiner* — Michael J Zanelli
(74) *Attorney, Agent, or Firm* — Buchanan Ingersoll & Rooney PC

(57) ABSTRACT

A flight vehicle attitude control system design device includes: a gain calculator calculating a proportional gain and a derivative gain from a system natural frequency and a system damping coefficient; a margin calculator calculating a gain margin and a phase margin from the proportional gain and the derivative gain; a grid generator generating a gain-phase margin grid from a relationship between the proportional gain and the derivative gain and a relationship between the gain margin and the phase margin; and a display unit outputting the gain-phase margin grid on a control gain design region having a gain margin as one of a horizontal coordinate axis and a vertical coordinate axis and a phase margin as the other one of the horizontal coordinate axis and the vertical coordinate axis.

16 Claims, 5 Drawing Sheets

FLIGHT VEHICLE ATTITUDE CONTROL SYSTEM DESIGN METHOD AND DEVICE

CROSS-REFERENCE TO RELATED APPLICATION

This application claims the benefit of Korean Patent Application No. 10-2017-0168485, filed on Dec. 8, 2017, in the Korean Intellectual Property Office, the disclosure of which is incorporated herein in its entirety by reference.

BACKGROUND

1. Field

One or more embodiments relate to a flight vehicle attitude control system design method and device.

2. Description of the Related Art

A flight vehicle refers to a launch vehicle (Rocket), aircraft etc that obtains thrust through an engine. In the case of the flight vehicle, the uncertainty of the system is greatest up to an altitude of about 45 km after takeoff, as compared with other flight sections, due to atmospheric effects such as aerodynamic forces and wind. Thus, in an attitude control design process of the flight vehicle, an attitude control design engineer (hereinafter referred to as "designer") of the flight vehicle considers the securement of a sufficient stability margin rather than the response performance of the system as an important factor of the attitude control design, in order to provide robustness against the influence of a dynamic mode (aerodynamic, thrust, sloshing, bending, etc.) deviating from design values.

In general, the attitude stability in a high-frequency region is determined by the interrelationship between the bending of a flight vehicle, engine inertia effects (tail-wags-dog (TWD)), thrust vector control (TVC) actuator dynamic characteristics, and a bending stabilization filter. The attitude stability in a low-frequency region is determined by the interrelationship between aerodynamic forces, thrust, gravity, sloshing (liquid fuel motion characteristics), TVC actuator dynamic characteristics, and attitude controller control gains.

In most flight vehicles, a proportional-derivative (PD) controller mode may be mainly used as a low-frequency band attitude control, and their control gains may be obtained by using a gain scheduling method based on the relationship between changes in system parameters over time, design control frequencies, and damping coefficients.

Information disclosed in this Background section was already known to the inventors before achieving embodiments of the present disclosure or is technical information acquired in the process of achieving embodiments of the present disclosure. Therefore, it may contain information that does not form the prior art that is already known to the public in this country.

SUMMARY

One or more embodiments include a flight vehicle attitude control system design method and device which may intuitively determine attitude stability and attitude control performance-related indexes in the process of selecting a control gain in flight conditions.

Additional aspects will be set forth in part in the description which follows and, in part, will be apparent from the description, or may be learned by practice of the presented embodiments.

According to one or more embodiments, a flight vehicle attitude control system design device includes: a gain calculator calculating a proportional gain and a derivative gain from a system natural frequency and a system damping coefficient; a margin calculator calculating a gain margin and a phase margin from the proportional gain and the derivative gain; a grid generator generating a gain-phase margin grid from a relationship between the proportional gain and the derivative gain and a relationship between the gain margin and the phase margin; and a display unit outputting the gain-phase margin grid on a control gain design region having a gain margin as one of a horizontal coordinate axis and a vertical coordinate axis and a phase margin as the other one of the horizontal coordinate axis and the vertical coordinate axis.

According to one or more embodiments, a flight vehicle attitude control system design method includes: a first operation of calculating an nth proportional gain and an nth derivative gain from an nth system natural frequency and an nth system damping coefficient representing dynamic characteristics of a flight vehicle with respect to an nth time; a second operation of calculating an nth gain margin and an nth phase margin from the nth proportional gain and the nth derivative gain; a third operation of generating an nth gain-phase margin grid from a relationship between the nth proportional gain and the nth derivative gain and a relationship between the nth gain margin and the nth phase margin; and a fourth operation of outputting the nth gain-phase margin grid on a control gain design region having a gain margin as one of a horizontal coordinate axis and a vertical coordinate axis and a phase margin as the other one of the horizontal coordinate axis and the vertical coordinate axis.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
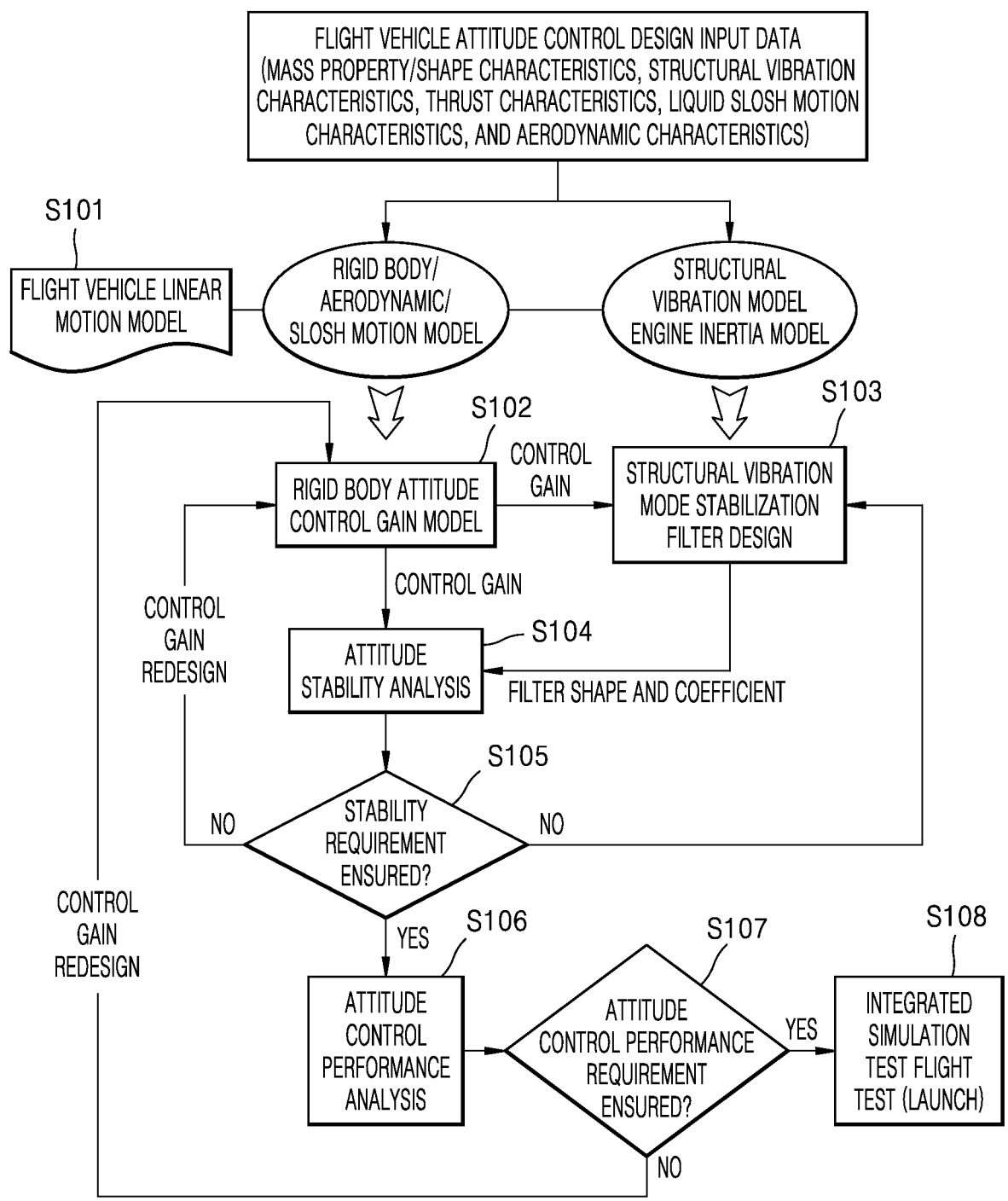
FIG. 1 is a flowchart schematically illustrating a flight vehicle attitude control gain design process of the related art.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The present disclosure may include various embodiments and modifications, and certain embodiments thereof are illustrated in the drawings and will be described herein in detail. The effects and features of the present disclosure and the accomplishing methods thereof will become apparent from the following description of the embodiments taken in conjunction with the accompanying drawings. However, the present disclosure is not limited to the embodiments described below, and may be embodied in various modes.

It will be understood that although the terms "first", "second", etc. may be used herein to describe various components, these components should not be limited by these terms. These terms are only used to distinguish one component from another component. Also, as used herein, the singular forms "a", "an", and "the" are intended to include the plural forms as well, unless the context clearly indicates otherwise.

Also, it will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Also, the embodiments may be described in terms of functional block components and various processing operations. Such functional blocks may be implemented by any number of hardware and/or software components that execute particular functions. For example, the embodiments may employ various integrated circuit (IC) components, such as memory elements, processing elements, logic elements, and lookup tables, which may execute various functions under the control of one or more microprocessors or other control devices.

Similarly, where the elements of the embodiments may be implemented by software programming or software elements, the embodiments may be implemented by any programming or scripting language such as Fortran, C, C++, Java, Assembler, MATLAB (SIMULINK), or UML, with various algorithms being implemented by any combination of data structures, processes, routines, or other programming elements. Functional aspects may be implemented by an algorithm that is executed in one or more processors.

Also, the embodiments may employ the related art for electronic environment setting, signal processing, and/or data processing. Terms such as "mechanism", "element", "unit", and "configuration" may be used in a broad sense, and are not limited to mechanical and physical configurations. The terms may include the meaning of software routines in conjunction with processors or the like.

Hereinafter, embodiments will be described in detail with reference to the accompanying drawings. In the following description, like reference numerals will denote like elements, and redundant descriptions thereof will be omitted.

Hereinafter, general flight vehicle attitude control design will be schematically described, before describing embodiments in detail with reference to the accompanying drawings.

FIG. 1 is a flowchart schematically illustrating a flight vehicle attitude control gain design process of the related art.

Referring to FIG. 1, flight vehicle attitude control design may start with modeling a linear system of the flight vehicle (S101). For example, the flight vehicle may have its own mass property and shape, and thus data such as structural vibration characteristics, thrust characteristics, and sloshing may be quantified. In this case, a designer may design a control gain by comparison between rigid body characteristics of the flight vehicle, aerodynamic characteristic data, and control natural frequencies, and damping coefficients (S102) and may design the shape and coefficients of a structural vibration mode stabilization filter of the flight vehicle by considering the set control gain and the bending mode of the flight vehicle together (S103).

Next, by considering the design parameters (control gain and stabilization filter shape and coefficients) set by the designer, the attitude stability of a linear open-loop system including the overall dynamic characteristics (rigid body, aerodynamic force, sloshing, engine inertia, bending, inertial navigation device, etc.) of the flight vehicle may be analyzed (S104). When a system fails to secure the attitude stability requirements (S105), the designer may reset the control gain and the shape and the coefficients of the stabilization filter (S102 and 103) and analyze the attitude stability again (S104). Herein, the 'control gain' may be a concept including a proportional gain and a derivative gain. Hereinafter, the proportional gain and the derivative gain will be collectively referred to as the 'control gain'.

Next, when the attitude stability requirements of the system are satisfied (S105), the attitude control performance of the flight vehicle may be analyzed (S106), and when the attitude control performance of the flight vehicle is satisfied (S107), the results may be analyzed by applying the control gain and a bending stabilization filter to a nonlinear 6-degree-of-freedom flight simulation (S108). When the attitude control performance of the flying object is not satisfied (S107), the control gain and the shape and the coefficients of the stabilization filter may be reset (S102 and S103) to analyze the attitude stability and the attitude control performance again (S104 and 106) to determine whether to perform a simulation (S108) (this series of processes will be referred to as "design optimization").

In the case of the flight vehicle attitude control gain design of the related art, it is general that the range of the design requirements is not clearly presented at the initial stage of the flight vehicle attitude control design. Therefore, after the attitude control design parameters are initially determined to perform optimization, when the design requirements are changed or the design input data is changed, a full redesign process may be performed.

The above flight vehicle attitude control gain design process is a schematic, and there is no formal form or design tool up to now. Thus, the flight vehicle attitude control design process may tend to depend on the experience or skill of the designer, and the design results may vary depending on the designers even in the same condition.

Also, since the designer has to leave a record of the intermediate results for each process in order to verify the control gain value and the simulation results determined through the flight vehicle attitude control design, an additional work load may occur. Also, since a manager to verify and certify the design did not actually participate in the design and thus lacks expertise in comparison with the designer, it may be difficult to ensure objective and reliable standards.

Embodiments are designed to solve the above problems and various other problems shared by the designers in the flight vehicle attitude control gain design and will be described below in detail with reference to the accompanying drawings.

Figure 2:
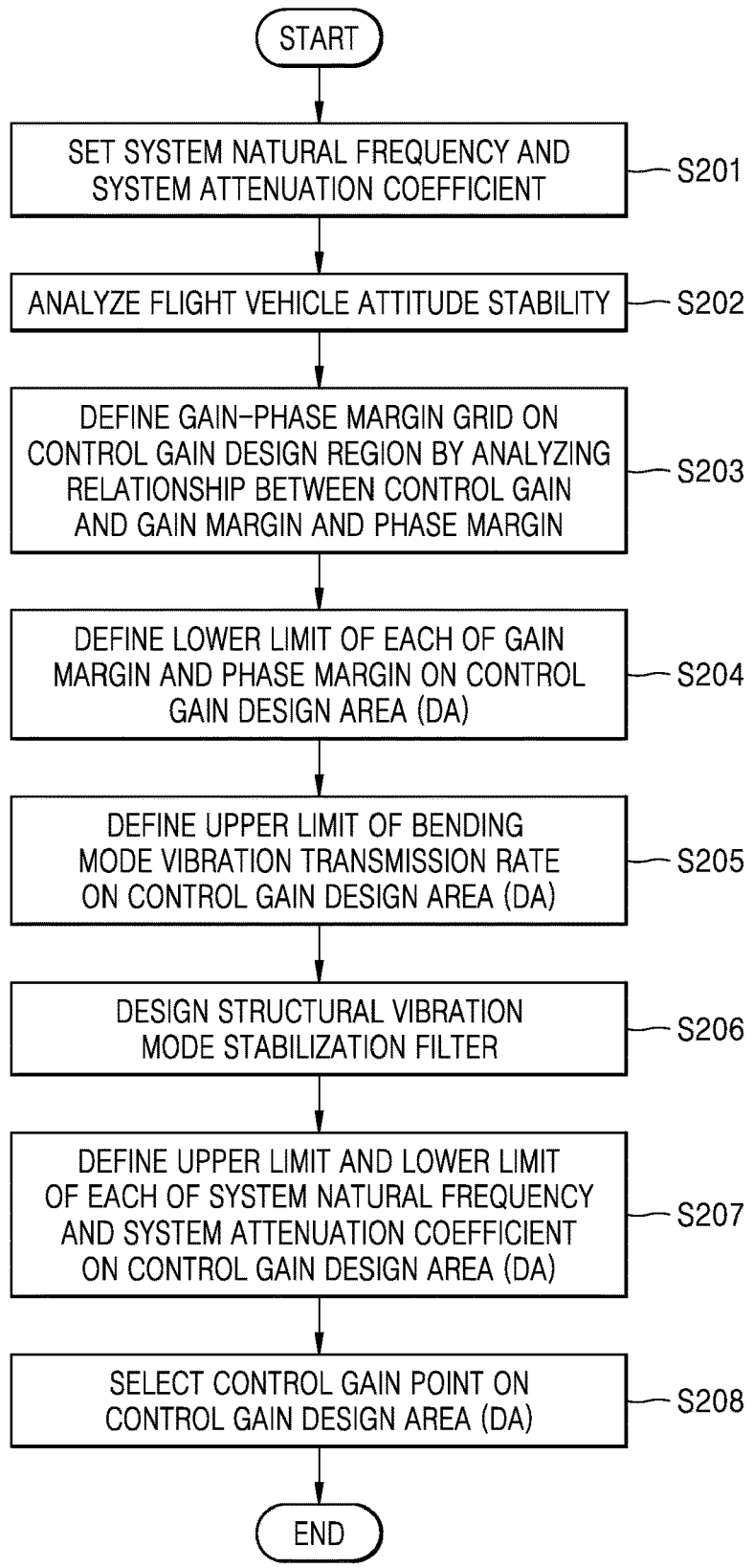
FIG. 2 is a flowchart schematically illustrating operations of a flight vehicle attitude control system design method according to an embodiment.
Figure 3:
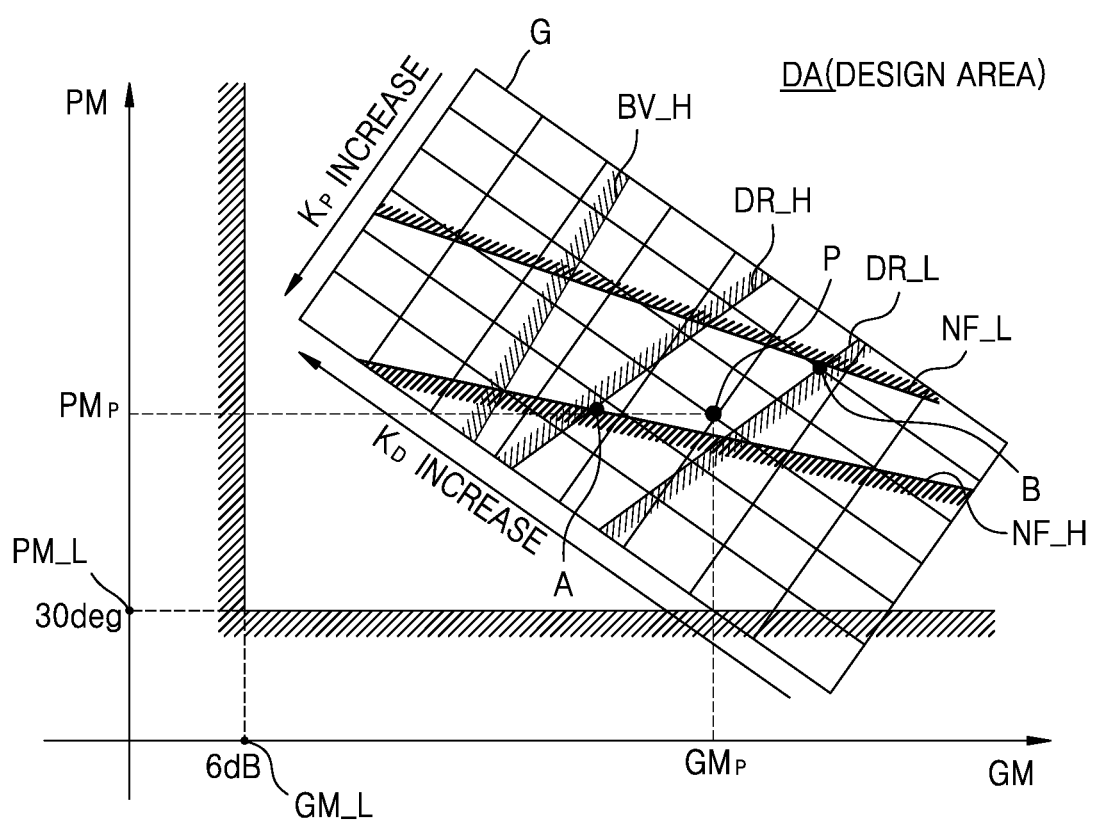
FIG. 3 is a graph of a coordinate system in which a gain-phase margin grid, a lower limit of each of a gain margin and a phase margin, an upper limit of a bending mode vibration transmission rate, and an upper limit and a lower limit of each of a system natural frequency and a system damping coefficient are represented on a control gain design region.

FIG. 2 is a flowchart schematically illustrating operations of a flight vehicle attitude control system design method according to an embodiment. FIG. 3 is a graph of a coordinate system in which a gain-phase margin grid, a lower limit of each of a gain margin and a phase margin, an upper limit of a bending mode vibration transmission rate, and an upper limit and a lower limit of each of a system natural frequency and a system damping coefficient are represented on a control gain design region.

Referring to FIGS. 2 and 3, the flight vehicle attitude control system design method according to an embodiment may include: obtaining a proportional gain and a derivative gain by setting a system natural frequency and a system damping coefficient (operation S201); obtaining a gain margin and a phase margin by analyzing an attitude stability of the flight vehicle based on the proportional gain and the derivative gain (operation S202); defining a gain-phase margin grid on a control gain design region having the gain margin as one of a horizontal coordinate axis and a vertical coordinate axis and the phase margin as the other one of the horizontal coordinate axis and the vertical coordinate axis by analyzing a relationship between the proportional gain and the derivative gain and a relationship between the gain margin and the phase margin (operation S203); defining a lower limit of each of the gain margin and the phase margin on the control gain design region (operation S204); defining an upper limit of a bending mode vibration transmission rate on the control gain design region (operation S205); designing a structural vibration mode stabilization filter based on the upper limit of the bending mode vibration transmission rate (operation S206); defining an upper limit and a lower limit of each of the system natural frequency and the system damping coefficient on the control gain design region (operation S207); and selecting, on the gain-phase margin grid, a control gain point simultaneously satisfying the lower limit of each of the gain margin and the phase margin, the upper limit of the bending mode vibration transmission rate, and the upper limit and the lower limit of each of the system natural frequency and the system damping coefficient (operation S208).

Particularly, in the operation S201 of obtaining the proportional gain and the derivative gain (hereinafter referred to as 'control gain'), the system natural frequency and the system damping coefficient may be set. The system natural frequency and the system damping coefficient may be input by the designer. That is, when the system natural frequency is $\omega_n$, the system damping coefficient $\zeta_n$, is a dimensional aerodynamic force moment coefficient is $M_\alpha$, and a dimensional thrust moment coefficient is $M_s$, the proportional gain $K_P$ and the derivative gain $K_D$ represented as a function thereof may be obtained through $$K_P = \frac{\omega_n^2 + M_\sigma}{M_\delta} \text{ and} \qquad \text{[Equation 1]}$$

$$K_D = \frac{2\zeta_n \omega_n}{M_\delta}. \qquad \text{[Equation 2]}$$

Herein, the dimensional aerodynamic force moment coefficient $M_a$ may represent a value obtained by dividing the product of the lateral aerodynamic force and the aerodynamic force center/gravity center relative distance by the projectile inertia moment.

Also, the dimensional thrust moment coefficient $M_s$ may represent a value obtained by dividing the lateral thrust force and thrust action point/gravity center relative distance by the lateral inertia moment.

In detail, [Equation 1] and [Equation 2] may be simplified equations derived from the thrust force, aerodynamic force, and mass property characteristics of the flight vehicle, and the control gain (the proportional gain $K_P$ and the derivative gain $K_D$) may be determined through the equations (S201).

Next, the gain margin GM and the phase margin PM may be numerically obtained by analyzing the attitude stability of the flight vehicle based on the obtained control gain (S202).

In detail, since an open-loop transfer function of a general attitude control system may be complicated and coupled by the mass property, thrust, aerodynamic, liquid propellant sloshing (liquid fuel flow (fluid dynamics) characteristics), thrust vector control drive, engine inertial effect, and structural vibration characteristics of the flight vehicle, an open-loop transfer function $$\left( G(j\omega) = \frac{N(j\omega)}{D(j\omega)} = \frac{N(j\omega)D^*(j\omega)}{|D(j\omega)|^2} \right) \qquad \text{[Equation 3]}$$

may be defined in the form of a denominator $D(j\omega)$ and a numerator $N(j\omega)$, which is a function of a frequency $\omega$, and the gain margin GM and phase margin PM of the attitude stability may be determined from the relationship with $$GM = -\frac{1}{G(j\omega_{pc})}, \; PM = 180 \text{ deg} + < G(\omega_{gc}). \qquad \text{[Equation 4]}$$

[Equation 3] may include the dynamic characteristics of all flight vehicles. Since each of the denominator $D(j\omega)$ and the numerator $N(j\omega)$ may be represented as a function of the control gain, the proportional gain $K_P$, and the derivative gain $K_D$ designed in advance and may be represented in the form of a 10-order or more complex polynomial, a numerical analysis method may be applied to the solutions of [Equation 3] and [Equation 4].

Next, the relationship between a plurality of control gains and a plurality of gain margins and phase margins may be tabulated based on a plurality of control gain values obtained through [Equation 1] and [Equation 2]. The table of the plurality of control gains and the plurality of gain margins and phase margins may be defined on a control gain design region DA ("Design Area") having the gain margin GM as a horizontal coordinate axis and the phase margin PM as a vertical coordinate axis like a gain-phase margin grid G illustrated in FIG. 3 (S203). As such, when the gain-phase margin grid G is defined on the control gain design region DA, the designer may intuitively determine the attitude stability and control performance-related indexes, that is, the gain margin GM and the phase margin PM, in the process of selecting the control gain.

Next, a lower limit GM_L of the gain margin and a lower limit PM_L of the phase margin may be defined on the control gain design region DA (S204). For example, in the case of a launch vehicle (rocket), the lower limit GM_L of the gain margin may be 6 dB and the lower limit PM_L of the phase margin may be 30 deg, although it depends on a target flight vehicle to be designed. The designer may consider the lower limit GM_L of the gain margin and the lower limit PM_L of the phase margin in setting the control gain point on the gain-phase margin grid G. Particularly, the gain margin corresponding to the control gain point may be set to exceed the lower limit GM_L of the gain margin and the phase margin corresponding to the control gain point may be set to exceed the lower limit PM_L of the phase margin.

Next, an upper limit BV_H of the bending mode vibration transmission rate may be defined on the control gain design region DA (S205). Particularly, the upper limit BV_H of the bending mode vibration transmission rate may be defined by [Equation 5] below.

That is, when a pitch/yaw control thrust is $T_c$ the proportional gain is $K_P$, the derivative gain is $K_D$, an ith-order bending mode slope at an angular velocity meter position is $\sigma_{P,i}$ and $\sigma_{R,i}$ an ith-order bending mode shape at a thrust vector control (TVC) gimbal position is $\phi_{tvc,i}$, an ith-order bending mode damping coefficient is $\zeta_{bd,i}$, an ith-order bending mode natural frequency is $\omega_{bd,i}$, and an ith-order bending mode generalized mass is $M_{bd,i}$, an upper limit $K_{BT,i}$ of an ith-order bending mode vibration transmission rate represented as a function thereof may be defined by $$K_{BT,i} = \left| \frac{T_c \phi_{tvc,i}}{M_{bd,i}} \frac{(K_P \sigma_{P,i} + j\omega_{bd,i} K_D \sigma_{R,i})}{2\zeta_{bd,i}\omega_{bd,i}^2} \right|. \quad \text{[Equation 5]}$$

Herein, the pitch/yaw control thrust $T_c$ may refer to a lateral thrust force generated by a flight vehicle engine.

Also, the ith-order bending mode slope $\sigma_{P,i}$ and $\sigma_{R,i}$ may refer to an angular velocity caused by a structural vibration (bending mode) measured at angular rate sensor which is attached to flight vehicle.

Also, the ith-order bending mode shape $\phi_{tvc,i}$ at the TVC gimbal position may refer to a relative displacement caused by a structural vibration (bending mode) at a thrust vector control gimbal hinge position.

Also, the ith-order bending mode damping coefficient $\zeta_{bd,i}$ may refer to a structural vibration (bending mode) size damping ratio.

Also, the ith-order bending mode natural frequency $\omega_{bd,i}$ may refer to a frequency range in which a structural vibration (bending mode) occurs.

Also, the ith-order bending mode generalized mass $M_{bd,i}$ may have a normalized value of the total mass of the flight vehicle for a structural vibration mode operation for analysis and may generally have a value of '1'.

Particularly, the designer may design a structural vibration mode stabilization filter of the flight vehicle based on the upper limit BV_H of the bending mode vibration transmission rate (S206).

More particularly, depending on the design purpose of a bending mode stabilization filter and a target flight vehicle to be designed, the upper limit BV_H of the bending mode vibration transmission rate for the launch vehicle (rocket) may be 15. Herein, the designer may consider the upper limit BV_H of the bending mode vibration transmission rate in setting the control gain point P on the gain-phase margin grid G. Particularly, the bending mode vibration transmission rate corresponding to the control gain point P may be smaller than the upper limit BV_H of the bending mode vibration transmission rate.

As represented in the relationship of [Equation 5], the bending mode vibration transmission rate may be represented as a 1-order linear function of the proportional gain $K_P$ and the derivative gain $K_D$, and the derivative gain $K_D$ may increase as the control gain increases (however, the effect of the proportional gain $K_P$ is limited). The increase of a bending mode vibration rate may increase a corresponding structural vibration gain peak in the bending mode natural frequency ($\omega_{bd,i}$) region. When the bending mode gain peak value increases, it may be difficult to ensure the attitude stability of the flight vehicle in a corresponding frequency region, the bending mode stabilization filter design order may increase, and the bending mode stabilization may become impossible in the worst case.

Next, an upper limit NF_H and a lower limit NF_L of the system natural frequency and an upper limit DR_H and a lower limit DR_L of the system damping coefficient may be defined on the control gain design region DA (S207). Herein, the upper limit NF_H of the system natural frequency may be 0.4 Hz and the lower limit NF_L of the system natural frequency may be 0.3 Hz. Also, the upper limit DR_H of the system damping coefficient may be 0.71 and the lower limit DR_L of the system damping coefficient may be 0.5.

Herein, the designer may consider the upper limit NF_H and the lower limit NF_L of the system natural frequency and the upper limit DR_H and the lower limit DR_L of the system damping coefficient in setting the control gain point P on the gain-phase margin grid G. Particularly, the system natural frequency corresponding to the control gain point P may be smaller than or equal to the upper limit NF_H of the system natural frequency and be greater than or equal to the lower limit NF_L of the system natural frequency P, and the system damping coefficient corresponding to the control gain point P may be smaller than or equal to the upper limit DR_H of the system damping coefficient and be greater than or equal to the lower limit DR_L of the system damping coefficient.

Next, the designer may select, on the gain-phase margin grid G of the control gain design region DA, a control gain point (e.g., "P" of FIG. 3) simultaneously satisfying the lower limit GM_L of the gain margin, the lower limit PM_L of the phase margin, and the upper limit BV_H of the bending mode vibration transmission rate, the upper limit NF_H and the lower limit NF_L of the system natural frequency, and the upper limit DR_H and the lower limit DR_L of the system damping coefficient (S208).

Particularly, in the case of setting the control gain corresponding to "P" of FIG. 3, since a value of "P" corresponding to the horizontal coordinate axis is a gain margin value $GM_P$ and a value thereof corresponding to the vertical coordinate axis is a phase margin value $PM_P$, the designer may intuitively determine the gain margin $GM_P$ and the phase margin $PM_P$ in the case of selecting the control gain point P on the gain-phase margin grid G.

In addition, as described below and illustrated in the drawings, the gain-phase margin grid G may have two axes that intersect each other, and one axis may have the same derivative gain value $K_D$ or proportional gain value $K_P$. For example, among the two axes of the gain-phase margin grid G, the derivative gain $K_D$ of the axis parallel to the horizontal coordinate axis may increase from the right side to the left side, and the proportional gain $K_P$ of the axis parallel to the vertical coordinate axis may increase from the top side to the bottom side.

Meanwhile, points A and B are defined on the gain-phase margin grid G of FIG. 3 to describe the relationship between the control gain and the design restrictions and the design region for setting the basic direction of the control gain design.

Hereinafter, referring to FIG. 3 and Table 1 together, the point A may be one of the candidate groups of the control gain point P that may be set in the case of setting the maximum system response performance as a condition. In the case of setting the control gain point P at the point A, the proportional gain and the derivative gain may increase and the gain margin and the phase margin may decrease, and thus the sloshing/bending mode gain peak may increase and the time response performance (over-response characteristics/attitude errors) of the system may be improved.

Meanwhile, the point B may be one of the candidate groups of the control gain point P that may be set in the case of setting the minimum control gain as a design condition. In the case of setting the control gain point P at the point B, the proportional gain and the derivative gain may relatively decrease and the gain margin and the phase margin may increase, and thus the sloshing/bending mode gain peak may decrease and the time response performance (overshoot/attitude errors) of the system may be degraded.

TABLE 1

| Category | Proportional Gain | Derivative Gain | Gain Margin | Phase Margin | Slosh/Bending Mode Gain Peak | Time Response Performance (Over Response Characteristics/ Attitude Error) |
|---|---|---|---|---|---|---|
| System Response Performance Maximum (A) | ↑ | ↑ | ↓ | ↓ | ↑ | ↑ |
| Control Gain Minimum (B) | ↓ | ↓ | ↑ | ↑ | ↓ | ↓ |

As described above, in an embodiment, the designer sets the system natural frequency and the system damping coefficient once in selecting the control gain point P; however, embodiments are not limited thereto. This will be described below in detail with reference to FIG. 4.

Figure 4:
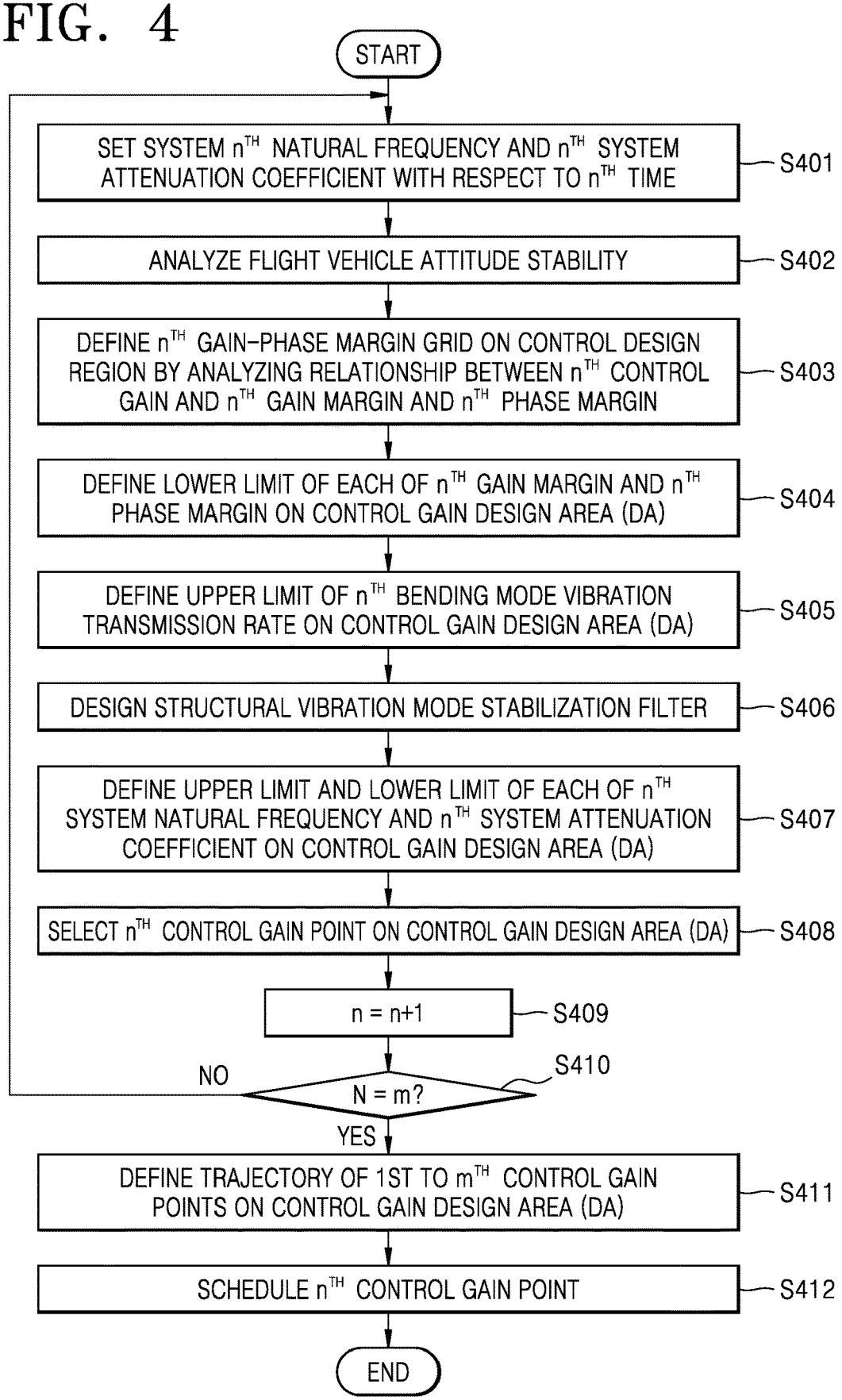
FIG. 4 is a flowchart illustrating a flight vehicle attitude control system design method according to another embodiment.

FIG. 4 is a flowchart illustrating a flight vehicle attitude control system design method according to another embodiment.

Referring to FIG. 4, the flight vehicle attitude control system design method according to another embodiment may include: an operation S401 of obtaining an $n^{th}$ proportional gain and an $n^{th}$ derivative gain by setting an $n^{th}$ system natural frequency and an $n^{th}$ system damping coefficient with respect to an $n^{th}$ time ("n" is a natural number); an operation S402 of obtaining an $n^{th}$ gain margin and an $n^{th}$ phase margin by analyzing an attitude stability of the flight vehicle based on the $n^{th}$ proportional gain and the $n^{th}$ derivative gain; an operation S403 of defining an $n^{th}$ gain-phase margin grid on a control gain design region having the $n^{th}$ gain margin as a horizontal coordinate axis and the $n^{th}$ phase margin as a vertical coordinate axis by analyzing a relationship between the $n^{th}$ proportional gain and the $n^{th}$ derivative gain and a relationship between the $n^{th}$ gain margin and the $n^{th}$ phase margin; an operation S404 of defining a lower limit of each of the $n^{th}$ gain margin and the $n^{th}$ phase margin on the control gain design region; an operation S405 of defining an upper limit of an $n^{th}$ bending mode vibration transmission rate on the control gain design region; an operation S406 of designing a structural vibration mode stabilization filter based on the upper limit of the $n^{th}$ bending mode vibration transmission rate; an operation S407 of defining an upper limit and a lower limit of each of the $n^{th}$ system natural frequency and the $n^{th}$ system damping coefficient on the control gain design region; an operation S408 of selecting, on the $n^{th}$ gain-phase margin grid, an $n^{th}$ control gain point simultaneously satisfying the lower limit of each of the $n^{th}$ gain margin and the $n^{th}$ phase margin, the upper limit of the $n^{th}$ bending mode vibration transmission rate, and the upper limit and the lower limit of each of the $n^{th}$ system natural frequency and the $n^{th}$ system damping coefficient; an operation S409 of selecting an $(n+1)^{th}$ control gain point on an $(n+1)^{th}$ gain-phase margin grid by repeating the operations S401 to S408 with respect to an $(n+1)^{th}$ time; an operation S410 and S411 of defining a trajectory of a plurality of first to $(1+m)^{th}$ control gain points on the control gain design region by repeating the operation S409 m times ("m" is a natural number); and an operation S412 of scheduling the $n^{th}$ control gain point based on the trajectory of the plurality of first to $(1+m)^{th}$ control gain points.

Particularly, the $n^{th}$ proportional gain and the $n^{th}$ derivative gain may be obtained by setting the $n^{th}$ system natural frequency and the $n^{th}$ system damping coefficient with respect to the $n^{th}$ time ("n" is a natural number) (S401).

Herein, since the $n^{th}$ time and the $(n+1)^{th}$ time are different from each other and the dynamic characteristics of the flight vehicle change over time, the $n^{th}$ proportional gain and the $(n+1)^{th}$ proportional gain may be obtained differently. Likewise, the $n^{th}$ derivative gain and the $(n+1)^{th}$ derivative gain may be obtained differently.

Next, the $n^{th}$ gain margin and the $n^{th}$ phase margin may be obtained by analyzing the attitude stability of the flight vehicle based on the obtained $n^{th}$ proportional gain and $n^{th}$ derivative gain (S402).

Next, the $n^{th}$ gain-phase margin grid G on the control gain design region DA having the $n^{th}$ gain margin as one of the horizontal coordinate axis and the vertical coordinate axis and the $n^{th}$ phase margin as the other one of the horizontal coordinate axis and the vertical coordinate axis may be defined by analyzing the relationship between the $n^{th}$ proportional gain and the $n^{th}$ derivative gain and the relationship between the $n^{th}$ gain margin and the $n^{th}$ phase margin (S403).

Thereafter, the lower limit GM_L of the $n^{th}$ gain margin and the lower limit PM_L of the $n^{th}$ phase margin may be defined on the control gain design region DA (S404) and the upper limit BV_H of the $n^{th}$ bending mode vibration transmission rate may be defined on the control gain design region DA (S405). Herein, a particular method of defining the upper limit BV_H of the $n^{th}$ bending mode vibration transmission rate may be the same as that of [Equation 5] described above, and thus redundant descriptions thereof will be omitted for conciseness.

Next, a structural vibration mode stabilization filter of the flight vehicle may be designed based on the upper limit BV_H of the $n^{th}$ bending mode vibration transmission rate (S406).

Also, the upper limit NF_H and the lower limit NF_L of the $n^{th}$ system natural frequency and the upper limit DR_H and the lower limit DR_L of the $n^{th}$ system damping coefficient may be defined on the control gain design region DA (S407).

Then, the $n^{th}$ control gain point P simultaneously satisfying the lower limit GM_L of the $n^{th}$ gain margin, the lower limit GM_L of the $n^{th}$ phase margin, the upper limit BV_H of the $n^{th}$ bending mode vibration transmission rate, the upper limit NF_H and the lower limit NF_L of the $n^{th}$ system natural frequency, and the upper limit DR_H and the lower limit DR_L of the $n^{th}$ system damping coefficient may be selected on the $n^{th}$ gain-phase margin grid G (S408).

Then, the first to $m^{th}$ gain-phase margin points P may be respectively defined on the first to $m^{th}$ gain-phase margin grids G in the control gain design region DA by repeating the operations S401 to S408 m times with respect to the $(n+1)^{th}$ time different from the $n^{th}$ time (S409 and S410), and thus the trajectory of the first to $m^{th}$ control gain points P defined on the first to $m^{th}$ gain-phase margin grids G may be defined on the control gain design region DA (S411).

More particularly, a plurality of gain-phase margin grids G corresponding to different times may be defined on the control gain design region DA by performing the flight vehicle attitude control system design method according to the embodiment with respect to different times a plurality of times (S403), and thus different $n^{th}$ control gain points P may be set at different times (S408). According to this method, the trajectory of the $n^{th}$ control gain point changing over time may be defined on the control gain design region DA (S411), and the control gain point that may continuously maintain the attitude stability of the flight vehicle and the satisfaction of the attitude control response performance (S412) may be scheduled with reference to the trajectory of the $n^{th}$ controlled gain point P.

In summary, the flight vehicle attitude control system design method according to another embodiment illustrated in FIG. 4 may perform the flight vehicle attitude control system design method according to an embodiment illustrated in FIG. 1 at different times a plurality of times after the launch of the flight vehicle, to define the $n^{th}$ gain-phase margin grid G corresponding to each time on the control gain design region DA (S403), select the $n^{th}$ control gain point simultaneously satisfying the lower limit of each of the $n^{th}$ gain margin and the $n^{th}$ phase margin $n^{th}$, the upper limit of the $n^{th}$ bending mode vibration transmission rate, and the upper limit and the lower limit of each of the $n^{th}$ system natural frequency and the $n^{th}$ system damping coefficient (S408), and plot the trajectory of the $n^{th}$ control gain point P on the control gain design region DA by repeating a series of operations S401 to S408 for selecting the $n^{th}$ control gain point (S411).

When the trajectory of the $n^{th}$ control gain point P is plotted in the control gain design region DA according to the flight vehicle attitude control system design method according to another embodiment, control gain scheduling design for maintaining the satisfaction of the attitude control response performance and the attitude stability of the flight vehicle may be implemented (S412). That is, since the control gain, the gain margin, and the phase margin value corresponding to each time may be intuitively determined with reference to the trajectory of the $n^{th}$ control gain point P plotted on the control gain design region DA, even when the design requirements are changed, it may be unnecessary to additionally analyze whether the existing control gain satisfies the changed design requirements by fully redesigning a flight vehicle attitude control system.

According to the embodiments described above, the attitude stability and attitude control performance-related indexes may be intuitively determined in the process of selecting a control gain in a particular flight condition.

Also, in addition to a relative attitude stability discrimination function according to the control gain range, the attitude stability may be represented in a quantitative numerical form in the process of selecting an individual control gain, the objectivity of the design process and the results thereof may be secured through the design satisfying the design requirements, and the overall design process may be computerized by standardizing the design results.

Also, since the control gain change according to the corresponding flight condition or flight time may be intuitively followed by applying the above design method to various flight conditions or flight times, the flight condition or flight time reference control gain scheduling convenience may be provided.

Also, the control gain redesign may be performed intuitively and simply even in the case of a change in the design requirements or even under uncertain conditions.

Figure 5:
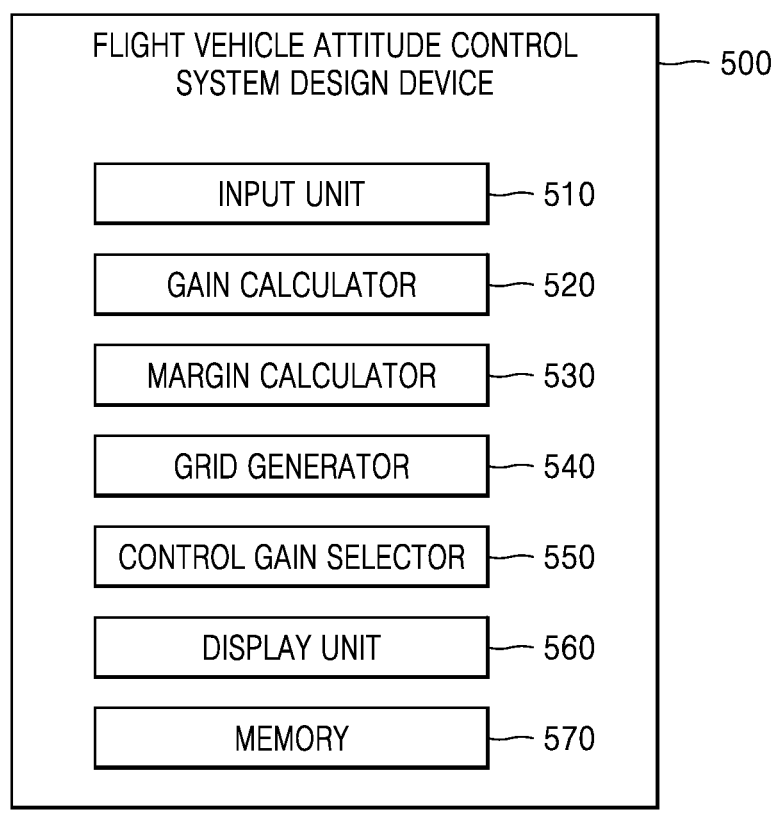
FIG. 5 illustrates a flight vehicle attitude control system design device according to an embodiment.

The flight vehicle attitude control system design method described above may be performed by a flight vehicle attitude control system design device illustrated in FIG. 5.

A flight vehicle attitude control system design device 500 may include at least one processor, an input unit 510, a gain calculator 520, a margin calculator 530, a grid generator 540, a control gain selector 550, a display unit 560, and at least one memory 570.

The input unit 510 may receive an input of commands or information from the designer and may include, but is not limited to, a keyboard, a mouse, a touch pad, a joystick, a voice recognition device, and/or the like.

The input unit 510 may receive an input of a system natural frequency, a system damping coefficient, the upper/lower limits of each of a gain margin and a phase margin, the upper/lower limits of each of the system natural frequency and the system damping coefficient, and a control gain point from the designer. That is, the operations S204, S207, and S208 illustrated in FIG. 2 and the operations S404, S407, and S408 illustrated in FIG. 4 may be performed by the input unit 510.

The gain calculator 520 may calculate a proportional gain and a derivative gain from the system natural frequency and the system damping coefficient. That is, the gain calculator 520 may perform the operation S201 illustrated in FIG. 2 and the operation S401 illustrated in FIG. 4.

The margin calculator 530 may calculate a gain margin and a phase margin from the proportional gain and derivative gain calculated by the gain calculator 520. That is, the margin calculator 530 may perform the operation S202 illustrated in FIG. 2 and the operation S402 illustrated in FIG. 4.

The grid generator 540 may generate a gain-phase margin grid from the relationship between the proportional gain and the derivative gain and the relationship between the gain margin and the phase margin. That is, the grid generator 540 may perform the operation S203 illustrated in FIG. 2 and the operation S403 illustrated in FIG. 4.

When a control gain point corresponding to a point on a control gain design region is input through the input unit 510, the control gain selector 550 may select a coordinate value of the control gain point as a control gain for flight vehicle attitude control.

In this case, the control gain selector 550 may determine whether the control gain point satisfies the lower limit of the gain margin, the lower limit of the phase margin, the upper limit of the bending mode vibration transmission rate, the upper/lower limits of the system natural frequency, and the upper/lower limits of the system damping coefficient.

That is, the control gain selector 550 may perform the operation S208 illustrated in FIG. 2 and the operations S408, S411, and S412 illustrated in FIG. 4.

The display unit 560 may output the gain-phase margin grid generated by the grid generator 540, on the control gain design region. Also, the display unit 560 may output the lower limit of the gain margin, the lower limit of the phase margin, the upper limit of the bending mode vibration transmission rate, the upper/lower limits of the system natural frequency, and the upper/lower limits of the system damping coefficient on the control gain design region.

The display unit 560 may include, but is not limited to, a liquid crystal display (LCD), an organic liquid crystal display (OLED), a cathode ray tube (CRT), a plasma display panel (PDP), and/or the like.

The at least one memory 570 may include a random access memory (RAM) such as a dynamic random access memory (DRAM) or a static random access memory (SRAM), a read-only memory (ROM), an electrically erasable programmable read-only memory (EEPROM), CD-ROM, Blu-ray, other optical disk storages, a hard disk drive (HDD), a solid state drive (SSD), or a flash memory. However, the present disclosure is not limited thereto. For example, the at least one memory 570 may include other external storage devices that may be accessed by the flight vehicle attitude control system design device 500.

The flight vehicle attitude control system design device 500 may include, but is not limited to, semiconductor devices such as a central processing unit (CPU), a micro controller unit (MCU), a microprocessor, a field programmable gate array (FPGA), and an application specific integrated circuit (ASIC) that may perform logical operations.

Although the present disclosure has been described with reference to the embodiments illustrated in the drawings, this is merely an example and those of ordinary skill in the art will understand that various modifications and other equivalent embodiments may be derived therefrom. Thus, the spirit and scope of the present disclosure should be defined by the appended claims.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A flight vehicle attitude control system design device comprising:
    input device receiving an input of a system natural frequency and a system damping coefficient;
    a gain calculator, using the system natural frequency and the system damping coefficient received by the input device, calculating a proportional gain and a derivative gain;
    a margin calculator, using the calculated proportional gain and the calculated derivative gain, calculating a gain margin and a phase margin;
    a grid generator generating a gain-phase margin grid from a relationship between the calculated proportional gain and the calculated derivative gain and a relationship between the calculated gain margin and the calculated phase margin; and
    a display unit outputting the generated gain-phase margin grid on a control gain design region having a gain margin as one of a horizontal coordinate axis and a vertical coordinate axis and a phase margin as the other one of the horizontal coordinate axis and the vertical coordinate axis.

2. The flight vehicle attitude control system design device of claim 1, wherein the display unit outputs a lower limit of the gain margin and a lower limit of the phase margin on the control gain design region.

3. The flight vehicle attitude control system design device of claim 2, wherein the display unit outputs an upper limit of a bending mode vibration transmission rate.

4. The flight vehicle attitude control system design device of claim 3, wherein the display unit outputs an upper limit and a lower limit of the system natural frequency and an upper limit and a lower limit of the system damping coefficient.

5. The flight vehicle attitude control system design device of claim 4, wherein the input device receives an input of a control gain point corresponding to a point on the control gain design region, and
    the flight vehicle attitude control system design device further comprises a control gain selector selects a coordinate value of the control gain point as a control gain for flight vehicle attitude control.

6. The flight vehicle attitude control system design device of claim 5, wherein the control gain selector determines whether the control gain point satisfies the lower limit of the gain margin and the lower limit of the phase margin.

7. The flight vehicle attitude control system design device of claim 3, wherein, when a pitch/yaw control thrust is $T_c$, the proportional gain is $K_P$, the derivative gain is $K_D$, an ith-order bending mode slope at a rate sensor location is $\sigma_{P,i}$ and $\sigma_{R,i}$, an ith-order bending mode shape at a thrust vector control (TVC) gimbal position is $\phi_{tvc,i}$, an ith-order bending mode damping coefficient is $\zeta_{bd,i}$, an ith-order bending mode natural frequency is $\omega_{bd,i}$, and an ith-order bending mode generalized mass is $M_{bd,i}$, an upper limit $K_{DT,i}$ of an ith-order bending mode vibration transmission rate represented as a function thereof is defined through $$K_{BT,i} = \left| \frac{T_c \phi_{tvc,i}}{M_{bd,i}} \frac{(K_P \sigma_{P,i} + j\omega_{bd,i} K_D \sigma_{R,i})}{2\zeta_{bd,i} \omega_{bd,i}^2} \right|. \quad \text{[Equation 5]}$$

8. The flight vehicle attitude control system design device of claim 1, wherein the display unit outputs the gain-phase margin grid obliquely with respect to a coordinate axis of the control gain design region.

9. The flight vehicle attitude control system design device of claim 1, wherein the gain-phase margin grid includes two axes intersecting each other,
    one of the two axes has the same derivative gain value, and
    the other one thereof has the same proportional gain value.

10. The flight vehicle attitude control system design device of claim 1, wherein, when the system natural frequency is $\omega_n$, the system damping coefficient is $\zeta_n$, a dimensional aerodynamic force moment coefficient is $M_\alpha$, and a dimensional thrust moment coefficient is $M_\delta$, the proportional gain $K_P$ and the derivative gain $K_D$ represented as a function thereof are obtained through $$K_P = \frac{\omega_n^2 + M_a}{M_\delta} \text{ and} \quad \text{[Equation 1]}$$

$$K_D = \frac{2\zeta_n \omega_n}{M_\delta}, \quad \text{[Equation 2]}$$

the gain margin and the phase margin are obtained from a relationship of open-loop transfer functions $$G(j\omega) = \frac{N(j\omega)}{D(j\omega)} = \frac{N(j\omega)D^*(j\omega)}{|D(j\omega)|^2} \text{ and} \quad \text{[Equation 3]}$$

$$GM = -\frac{1}{G(j\omega_{pc})}, PM = 180 \text{ deg} + <G(\omega_{gc}) \quad \text{[Equation 4]}$$

of an attitude control system in which dynamic characteristics of the flight vehicle are represented as a function of a frequency $\omega$, and $D(j\omega)$ and $N(j\omega)$ are represented as a function of the proportional gain $K_P$ and the derivative gain $K_D$.

11. A flight vehicle attitude control system design method performed by a flight vehicle attitude control system design device including at least one processor, an input device, and a display unit, the flight vehicle attitude control system design method comprising:

receiving, by the input device of the flight vehicle attitude control system design device, an $n^{th}$ system natural frequency and an $n^{th}$ system damping coefficient representing dynamic characteristics of a flight vehicle with respect to an $n^{th}$ time;

using the $n^{th}$ system natural frequency and the $n^{th}$ system damping coefficient received by the input device, calculating, by a gain calculator of the flight vehicle attitude control system design device, an $n^{th}$ proportional gain and an $n^{th}$ derivative gain;

using the calculated $n^{th}$ proportional gain and the calculated $n^{th}$ derivative gain, calculating, by a margin calculator, an $n^t$ gain margin and an $n^{th}$ phase margin;

generating, by a grid generator, an $n^{th}$ gain-phase margin grid from a relationship between the calculated $n^{th}$ proportional gain and the calculated $n^{th}$ derivative gain and a relationship between the calculated $n^{th}$ gain margin and the calculated $n^{th}$ phase margin; and outputting, by the processor, for display on a display unit, the generated $n^{th}$ gain-phase margin grid on a control gain design region having a gain margin as one of a horizontal coordinate axis and a vertical coordinate axis and a phase margin as the other one of the horizontal coordinate axis and the vertical coordinate axis.

12. The flight vehicle attitude control system design method of claim 11, further comprising:

receiving, by the input device, an input of an $n^{th}$ control gain point corresponding to a point on the control gain design region; and acquiring, by the processor, an $n^{th}$ control gain for attitude control of the flight vehicle from a coordinate value of the $n^{th}$ control gain point.

13. The flight vehicle attitude control system design method of claim 11, further comprising an operation of outputting an $(n+1)^{th}$ gain-phase margin grid on the control gain design region by repeating the calculating, generating and outputting operations with respect to an $(n+1)^{th}$ time.

14. The flight vehicle attitude control system design method of claim 11, wherein the dynamic characteristics of the flight vehicle vary as the time changes.

15. The flight vehicle attitude control system design method of claim 11, further comprising an operation of outputting at least one of a lower limit of the $n^{th}$ gain margin, a lower limit of the $n^{th}$ phase margin, an upper limit of an $n^{th}$ bending mode vibration transmission rate, an upper limit and a lower limit of the $n^{th}$ system natural frequency, and an upper limit and a lower limit of the $n^{th}$ system damping coefficient on the control gain design region.

16. The flight vehicle attitude control system design method of claim 15, further comprising an operation of determining whether the $n^{th}$ control gain point satisfies the at least one limit.

* * * * *